United States Patent [19]
Gortych et al.

[11] Patent Number: 5,680,588
[45] Date of Patent: Oct. 21, 1997

[54] METHOD AND SYSTEM FOR OPTIMIZING ILLUMINATION IN AN OPTICAL PHOTOLITHOGRAPHY PROJECTION IMAGING SYSTEM

[75] Inventors: Joseph Edward Gortych, Essex Junction, Vt.; Alan Edward Rosenbluth, Yorktown Heights, N.Y.

[73] Assignee: International Business Machines Corporation, Armonk, N.Y.

[21] Appl. No.: 471,103

[22] Filed: Jun. 6, 1995

[51] Int. Cl.$^6$ ................................................. H01L 21/31
[52] U.S. Cl. .................. 395/500; 430/311; 430/313; 430/316
[58] Field of Search ........................ 362/297; 355/67; 356/400, 401, 360; 378/34; 250/201.9, 548, 492.1; 430/5, 311, 312, 310, 302, 313, 314, 316; 395/500

[56] References Cited

U.S. PATENT DOCUMENTS

| | | | |
|---|---|---|---|
| 4,241,389 | 12/1980 | Heimer | 362/297 |
| 4,348,105 | 9/1982 | Caprari | 355/67 |
| 4,560,235 | 12/1985 | Servaes et al. | 350/96.24 |
| 4,819,033 | 4/1989 | Yoshitake et al. | 355/53 |
| 4,869,999 | 9/1989 | Fukuda et al. | 430/311 |
| 4,890,239 | 12/1989 | Ausschnitt et al. | 364/491 |
| 4,929,083 | 5/1990 | Brunner | 356/400 |
| 4,947,413 | 8/1990 | Jewell et al. | 378/34 |
| 5,137,363 | 8/1992 | Kosugi et al. | 356/401 |
| 5,142,132 | 8/1992 | MacDonald et al. | 250/201.9 |
| 5,202,748 | 4/1993 | MacDonald et al. | 356/360 |
| 5,300,786 | 4/1994 | Brunner et al. | 250/548 |
| 5,326,659 | 7/1994 | Liu et al. | 430/5 |
| 5,340,700 | 8/1994 | Chen et al. | 430/312 |
| 5,363,170 | 11/1994 | Muraki | 355/67 |
| 5,415,835 | 5/1995 | Brueck et al. | 430/311 |
| 5,447,810 | 9/1995 | Chen et al. | 430/5 |
| 5,559,338 | 9/1996 | Elliott et al. | 250/492.1 |

OTHER PUBLICATIONS

M. Noguchi et al., "Sub–half micron lithography system with phase-shifting effect," *SPIE Proceedings, vol. 1671–Optical/Laser Microlithography I*, J. Cuthbert, Ed. (Society of Photo–Optical Instrumentation Engineers, Bellingham, WA, 1992), pp. 92–104.

Douglas Goodman, "Optics of Photolithography", Optical Society of America, OptCon Meeting, Santa Clara, California, 1988, pp. 112–117.

Parlo, Fields, and Oldham, "Direct Aerial Image Measurement as a Method of Testing High Numerical Aperture Microlithographic Lenses", 37th International Symposium on Electron, Ion, and Photon Beams, San Diego, California, in Jun. 1993.

H. H. Hopkins, "Image Formation with Coherent and Partially Coherent Light," *Photographic Science and Engineering*, vol. 21, #3, May/Jun. 1977, p. 114.

D.G. Flagello and A.E. Rosenbluth, "Vector Diffraction Analysis of Phase–mask Imaging into Photoresist," *SPIE 1993 Microlithography Conference*, San Jose, CA, 1993.

(List continued on next page.)

*Primary Examiner*—Kevin J. Teska
*Assistant Examiner*—Russell W. Frejd
*Attorney, Agent, or Firm*—Lawrence H. Meier; Eugene I. Shkurko

[57] ABSTRACT

A method and system for finding and setting the illumination in a projection imaging system to achieve optimum imaging. The global optimum illumination is found based on the desired characteristics of the image irradiance distribution as embodied in a target aerial image. The system employs an optimization algorithm that finds the best combination of projected mask images, each such image formed by directing source illumination to selected regions (e.g., pixels) in the entrance pupil (each such region location and size corresponding to a nominal illumination direction and a particular range of angles about the nominal). The optimum illumination is defined as that illumination which produces an aerial image closest to the predefined target aerial image. The system then sets the illuminator to produce the source distribution necessary to achieve this optimal illumination. The set of aerial images created by addressing the available entrance pupil regions with illumination is determined either by numerical calculation or by scanning and recording the individual aerial images produced by the projection system.

25 Claims, 11 Drawing Sheets

OTHER PUBLICATIONS

IBM's Optimization Subroutine Library(OSL), *IBM Systems Journal*, vol. 31, No. 1, 1992(IBM publication #sc23-0519-03).

M. Avriel, *Non–linear Programming*, Prentice Hall, 1976.

T. Brunner, "Rim Phase–Shift Mask Combined with Off–Axis Illumination: a Path to 0.5λ/NA Geometries," *SPIE Proceedings, vol. 1927—Optical/Laser Microlithography*, J. Cuthbert, Ed. (Society of Photo–Optical Instrumentation Engineers, Bellingham, WA, 1993), pp. 54–62.

H. Sewell, "A New Dimension in Phase–Shift Mask Technology," *SPIE Microlithography* 1993, San Jose, CA.

H. Jinbo and Y. Yamashita, "0.2 Micron or Less i–line Lithography by Phase–Shifting Mask Technology," *IEDM 1990 Technical Digest*, p. 825, IEEE, 1990.

P.H. Berning, *Physics of Thin Films*, G. Hass. Ed. (Academic Press 1963), pp. 69–121.

R. Fletcher, *Practical Methods of Optimization, vol. 2, Contrained Optimization* Wiley, 1981.

0.2 contour interval, 0.5 micron defocus 0.2 contour interval, 0.5 micron defocus

METHOD AND SYSTEM FOR OPTIMIZING ILLUMINATION IN AN OPTICAL PHOTOLITHOGRAPHY PROJECTION IMAGING SYSTEM

FIELD OF THE INVENTION

The present invention relates to projection imaging systems and, more particularly, to methods of optimizing the illumination generated by such systems.

BACKGROUND OF THE INVENTION

Optical photolithography has been widely used in the semiconductor industry in connection with the formation of a wide range of structures in integrated circuit (IC) chips. The fabrication of IC chips requires imaging systems that can suitably print, over a reasonable focal depth, the smallest structures required for the operation of the circuit.

As the device density in IC chips has increased, the size of the structures making up the devices has approached the wavelength of the exposure (actinic) light used in photolithographic optical projectors. The diminution in feature size relative to the actinic wavelength, combined with the limitations on the projector's ability to capture light diffracted by such structures, adversely affects the resolution of optical lithography. To deal with this problem, techniques and equipment have been developed to optimize the resolution of conventional optical lithography systems. For example, Ausschnitt et al. disclose in U.S. Pat. No. 4,890,239 a lithographic process analysis and control system for determining feature width, exposure and focus based on a predetermined mathematical model. Unfortunately, such techniques and equipment typically do not achieve sufficient resolution where features smaller than 0.5 microns are to be imaged. This suggests that to achieve future density increases in IC devices, alternative imaging techniques will be required.

Phase-shift mask technology is an example of one such alternative technology. Phase-shift mask technology relies on a variety of methods for introducing relative phase shifts in the electromagnetic field at the object (mask) plane. The introduction of phase shifts between two different transmitting regions of a fine-line lithographic mask feature causes destructive interference, darkening regions in the image where diffraction would otherwise cause residual constructive interference. While the effectiveness of phase-shift masks has been widely demonstrated, the technology is still nascent, due in part to the difficulty of constructing the phase-shifting regions for the variety of lithographic structures required for IC manufacturing. The phase-shifters represent an additional level of mask structure that must be aligned with the non-phase-shifted patterns, and in addition the shifters require a tighter and more complex set of fabrication tolerances than conventional mask patterns. Thus, even when phase-shift masks are made to work in practice, they typically provide only a one-shot improvement, because the above fabrication difficulties make impractical an iterative improvement of the masks to correct imaging problems found empirically. Moreover, phase-shift masks work by manipulating the image-forming process, instead of simply relying on image formation alone to faithfully reproduce an input pattern, as with standard masks. Phase-shift masks allow printed patterns with finer pitch than standard masks, but targeting a particular set of ground rules thus becomes more complicated. Thus, phase-shift mask technology, at least in its current state of development, does not appear to constitute an optimal solution to the problem of insufficient resolution of optical lithography in sub-0.5 micron regimes.

Alternative Illumination schemes, sometimes referred to as "off-axis" illumination, have been proposed to extend the range of conventional optical photolithography, e.g., the SHRINC system sold by Canon. Like phase-shift mask techniques, off-axis illumination methods manipulate the effective object phase, but they do so by adjusting the phase of the illuminating wavefront. Each direction of illumination produces a distinct continuous phase variation across the mask surface. Such variations have advantages and disadvantages compared with the discrete phase levels provided by phase-shifters on the mask. Another difference between conventional phase-shift masks and multiple illumination direction systems is that the images arising under the multiple phase distributions produced by the latter are incoherently superimposed with one another. For the oft-cited example of a grating, proper off-axis illumination directions serve to vary the illuminating phase between alternate grating bars in such a way that one of the first order diffracted beams (i.e. +1 or −1) is deviated outside the entrance pupil of the projector imaging lens. The effect is to produce a two-beam interference pattern on the wafer which is similar to the two-beam interference pattern produced by a Levenson-Shibuya phase mask, in which phase-shifters are used to alternate the phase at the mask. In other cases, the phase variation over the bright regions of the mask is sufficient to diminish the otherwise dominant zeroeth diffraction order, without eliminating it altogether. The effect is to weight the higher diffracted order terms more in the formation of the image, resulting in increased contrast, resolution and/or depth of focus.

Other off-axis illumination schemes are sometimes regarded as replacements for mask phase-shifting techniques. These schemes generally resemble the technique reported by M. Noguchi et al. in the article "Sub-half micron lithography system with phase-shifting effect," *SPIE Proceedings, Vol. 1671-Optical/Laser Microlithography L* J. Cuthbert, Ed. (Society of photo-Optical Instrumentation Engineers, Bellingham, Wash., 1992), pages 92–104. The Noguchi et al. scheme involves the use of four off-axis disk sources to image a sub-resolution grating (i.e., if the grating linewidth is expressed as $k_1$ $\lambda/NA$, then the method is particularly suitable for $k_1<0.7$). While this arrangement works reasonably well for grating-like features within a particular range of $k_1$ values, changing the orientation, pitch, line size, or pattern shape would necessitate altering the illumination arrangement, thereby adding to the cost and complexity of the system. An illumination system which is capable of providing different intensity distributions of the light source in a projection exposure system is described in U.S. Pat. No. 5,363,170 (the "'170 patent"). The invention described in the '170 patent includes a primary light source, an afocal optical system with variable magnification and an optical integrator. By varying the magnification of the afocal optical system disposed between the primary radiation source and the optical integrator, the intensity distribution defining a secondary source can be varied. While this system allows for some flexibility in changing the illumination, it is only capable of producing a limited number of different secondary sources. Moreover, the '170 patent does not teach a method of finding the optimum effective source size and shape for a given object or objects to be imaged and then providing such illumination. Successful IC fabrication and manufacturing with alternative illumination schemes will require the ability to image a wide variety of shapes, sizes, orientations, and periodicities. Known systems and techniques are either not believed to provide such imaging capabilities or are not able to provide such imaging on a cost effective, easily repeatable, basis.

Therefore, a need exists for techniques and equipment for enhancing the resolution of conventional optical projection systems, particularly conventional optical lithography systems.

SUMMARY OF THE INVENTION

One aspect of the present invention is a method for optimizing illumination for forming an image of a reticle object in a radiation-sensitive medium with an imaging system having a depth of focus and entrance pupil, an imaging plane located within the depth of focus, and a source of illumination. The method comprises a first step of optimizing the illumination provided by the source of illumination for imaging the reticle object through the entrance pupil and onto the imaging plane. Then, as a second step, the reticle is exposed to the optimized illumination to form an aerial image of the reticle feature and to transfer the aerial image into the radiation- sensitive medium placed at the imaging plane located within the depth of focus of the imaging system.

Another aspect of the present invention is an illumination optimization system designed for use with an imaging apparatus including a source of illumination, an imaging lens with an entrance pupil and a depth of focus, a reticle with one or more features to be imaged, and an imaging plane. The optimization system includes means for determining reticle feature aerial images at the imaging plane, such as an image scanning system, which converts irradiance into an electronic signal. Typically, many individual aerial images are formed by illuminating the reticle with light from different directions, one direction at a time. Each aerial image then corresponds to an individual illumination component directed into a given region in the entrance pupil. The aerial images are then stored electronically in an image analyzing means, such as a computer, where they are combined in a way that creates a single reticle feature image that most closely resembles the target image. The optimum illumination is defined as the illumination that forms a reticle image that differs the least from a target image. The system then sets the source of illumination to provide the optimal illumination via an illumination control means coupled to the image analyzer.

BRIEF DESCRIPTION OF THE DRAWINGS

For an understanding of the nature and objects of the present invention, reference should be made to the following detailed description taken in connection with the accompanying drawings, wherein:

FIG. 6 shows aerial image irradiance contours of the phase-shift mask of FIG. 5, based on computer simulations generated for the source distribution shown in FIG. 8a;

For clarity of presentation, the diagrams are not necessarily drawn to scale.

DETAILED DESCRIPTION OF THE INVENTION

Figure 1:
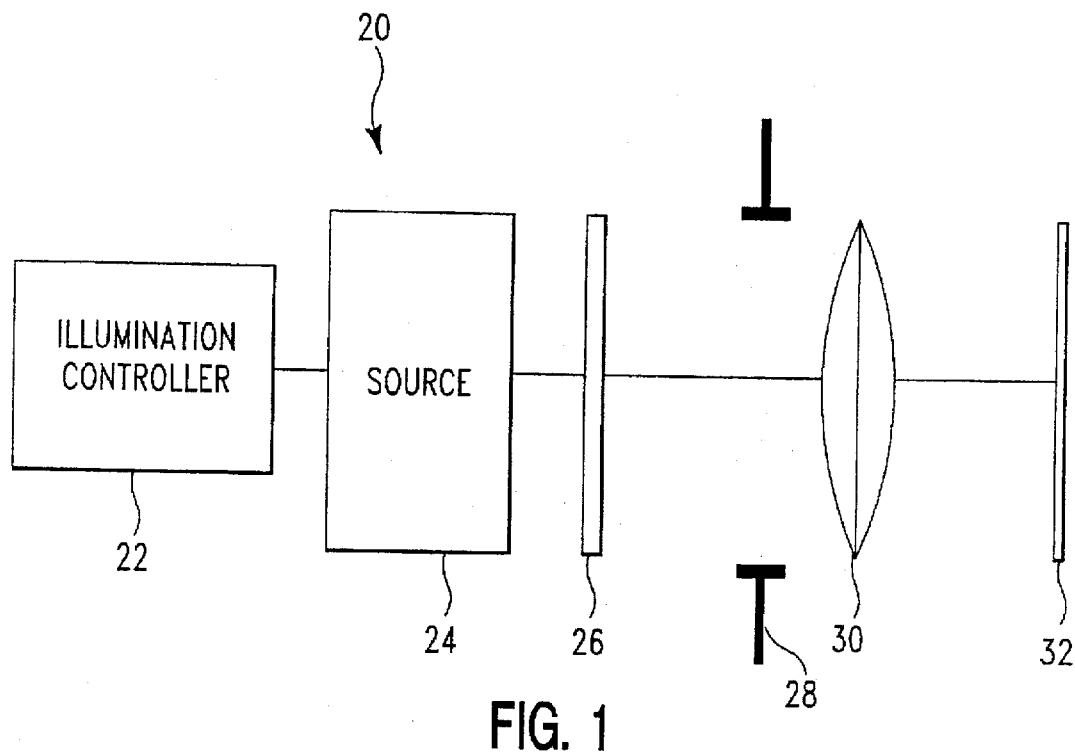
FIG. 1 is a schematic illustration of the optical projection system of the present invention, the system being illustrated in its most general form.

The present invention is a method of evaluating and optimizing illumination for optical projection systems, e.g., imaging systems of the type used in optical lithography, and a projection imaging system that operates in accordance with such method. Projection imaging system 20 of the present invention, which is schematically illustrated in FIG. 1, comprises an illumination controller 22 and an illumination source 24 coupled with and controlled by the controller so that the illumination the source generates is optimized. As described in more detail hereinafter, illumination controller 22 provides such control either by using illumination information obtained by scanning the image created at the image plane or by using numerical techniques based on a mathematical description of the projection system. System 20 also includes a reticle 26 positioned adjacent the output of source 24 and an entrance pupil 28 for projection imaging lens 30. The image plane for system 20 is identified at 32.

Figure 2:
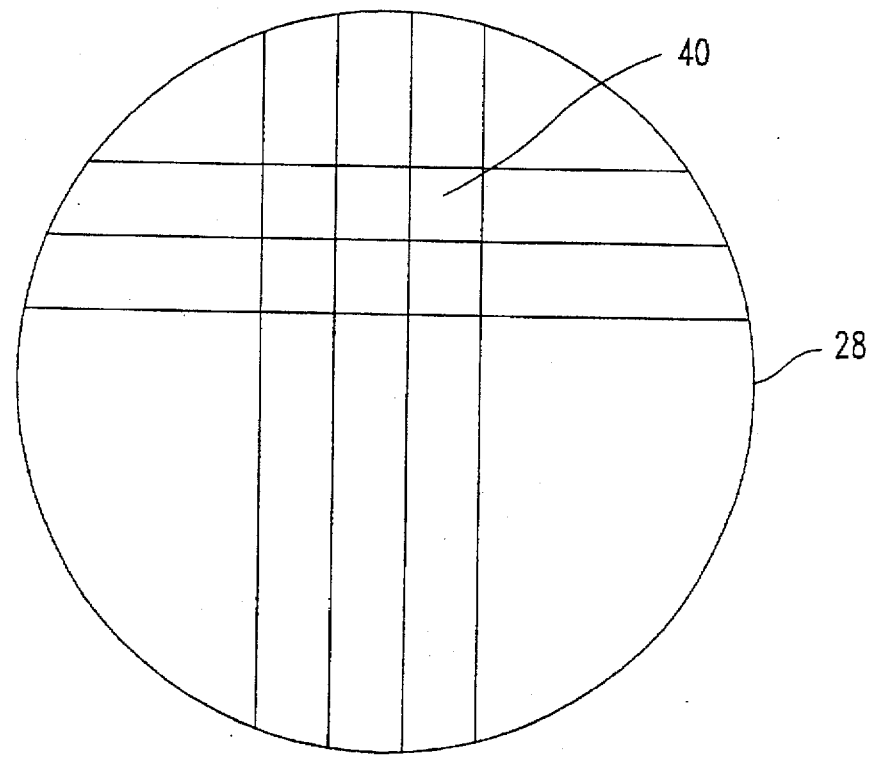
FIG. 2 is a front view of the entrance pupil of the projection imaging lens of the system illustrated in FIG. 1.

Referring to FIGS. 1 and 2, the construction and mode of operation of illumination source 24 may vary significantly, while still falling within the scope of the present invention. However, it is important that source 24 be capable of addressable imaging illumination within given coordinates of finite extent, hereinafter referred to as pupil pixels 40 (FIG. 2), in entrance pupil 28 of projection imaging lens 30. Pupil pixels 40 may, for example, represent the minimum area in the entrance pupil that is addressable with illumination, though the illumination sequences used in deriving the ultimate optimum illumination may be directed over an area in entrance pupil 28 greater than a single pixel. Source 24 should also be capable of illuminating reticle 26 with very good uniformity (approximately ≦±5%). Furthermore, it is preferred that source 24 be capable of illuminating reticle 26 with light from a range of angles. Each illumination direction produces a particular phase runout in illuminating reticle 26 and, in the absence of scattering by the reticle, will focus the light to a single pupil pixel 40. When source 24 is capable of providing illumination from a wide range of directions, the coherence in the overall phase distribution on reticle 26 is decreased, thereby reducing coherent ringing artifacts in the image formed at image plane 32.

Figure 3:
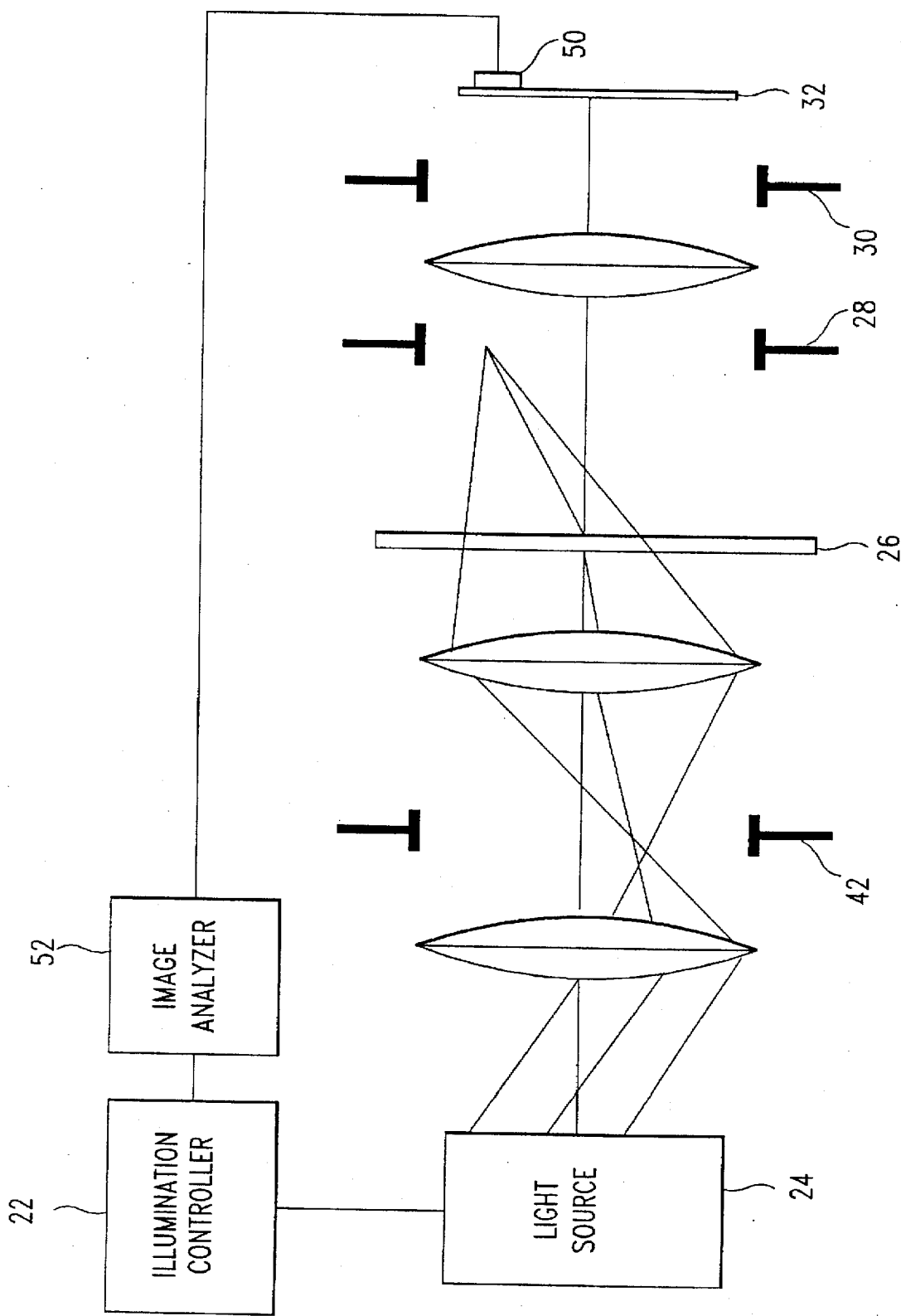
FIG. 3 is a schematic illustration of a specific embodiment of the system illustrated in FIG. 1.

Thus, source 24 may, for instance, comprise a unitary point source as shown in FIG. 3, such as an excimer laser that is designed to be scanned rapidly enough to create an effective extended source (not shown) in a plane 42, conjugate to the plane of entrance pupil 28. It will be appreciated by those skilled in the art that the concept of rapidly scanning a narrow beam say, with an electronically controlled mirror, to create an effective extended light source, is one obvious means for providing suitable illumination for the present invention. The concept of such an illumination system was presented by Douglas Goodman in "Optics of Photolithography" short course notes, Optical Society of America, OptCon Meeting, Santa Clara, Calif., 1988, pp. 112–117. By controlling the direction and intensity of the light generated by the point source on a pixel-by-pixel basis for the pixels 40 in entrance pupil 28, the best possible image can be constructed.

Alternatively, source 24 may consist of a cluster of closely spaced beams that are scanned simultaneously. The range of illumination directions subtended by this cluster (with the scanner turned off) should be sufficiently narrow (for example, NA'/10, where NA' is the numerical aperture of projection imaging lens 30 on the image plane side) that all beams produce essentially identical images. For this reason, the cluster can still be regarded as effectively a point source. Such a simultaneously scanned multiplicity of beams produces a smoother illumination of more uniform intensity in the reticle region where the beams overlap than could be readily accomplished with a single beam. Thus, use of a cluster source may be desirable where a relatively tight uniformity of illumination is preferred. Servaes and Reynolds have proposed in U.S. Pat. No. 4,560,235 a cluster source composed of optical fibers of different length to eliminate coherence effects which could be employed as source 24. An alternate means for providing suitable uniform illumination is described in U.S. Pat. No. 4,819,033, which discloses an illumination apparatus for projector imaging based on an excimer laser light source whose pulse-to-pulse intensity can be controlled, and whose optics direct the illumination into the entrance pupil of the projection lens from more than one direction at a time.

When the projection system 20 of the present invention is to be used in optical lithography, it is omen preferred that source 24 have x and/or y mirror symmetry, to accommodate the common microcircuit design practice of mirroring circuit patterns into the four quadrants of a chip, and also as a means of providing inversion symmetry through focus. To achieve this symmetry, illumination produced by source 24 and focused at position (x,y) in the pupil is focused as well at positions (x,-y), (-x,y), (-x,-y). It will be appreciated by those skilled in the art that reference to the coherent illumination produced by addressing a single pupil pixel describes, in a shorthand way, the highly structured coherence produced by, e.g., a four-fold pupil pixel with (x,y) mirror symmetry, possibly including a multiplicity of beams tightly clustered about each of these four minored directions.

Reticle 26 contains features to be imaged onto image plane 32. If system 20 is used in the microscopy art, reticle 26 may consist of a slide containing a test sample to be examined. Alternatively, when system 20 is to be used in optical lithography reticle 26 may consist of a mask containing features to be imaged in a selected thickness of photoresist (not shown) at image plane 32. Although not shown in FIG. 1, one or more lenses making up the imaging optics of system 20 are typically positioned between source 24 and reticle 26. Similarly, although projection imaging lens 30 is illustrated as a single lens, in practice a plurality of lenses may be used. System 20 may also include a conventional support (not shown) used for holding and positioning a radiation-sensitive medium, such as a semiconductor wafer coated with photoresist, in image plane 32.

Describing projection imaging system 20 in more detail, in the first embodiment of the invention; the illumination to be generated by system 20 is optimized based on information obtained by scanning the aerial image created at image plane 32. Referring to FIG. 3, such scanning is accomplished with a scanning system 50 and an image analyzer 52. Scanning system 50 is designed to provide an electronic output signal that varies as a function of the irradiance to which it is exposed. More particularly, system 50 is designed to provide such electronic output signal on a mapped basis, whereby for each x-y coordinate or pixel in the image being scanned an associated illumination intensity value is generated. To achieve this function, scanning system 50 includes a scanner (not shown) such as an optical slit detector and an x-y translation assembly (not shown) for moving the scanner back and forth along parallel paths lying in image plane 32.

A suitable image scanning system that could be used as scanning system 50 is described in the article by Patio, Fields and Oldham entitled "Direct Aerial Image Measurement as a Method of Testing High Numerical Aperture Microlithographic Lenses" presented at the 37th International Symposium on Electron, Ion, and Photon Beams, San Diego, Calif., in June of 1993. This system consists of a transmission grating placed over a photodetector and an electronic means for storing the measured signals. Constructing the grating with narrow openings separated by a suitable distance (in the Parlo et al. article, 0.2 μm openings separated by 0.4 μm), makes for a nearly ideal intensity sampling mechanism. The amount of light passing through the grating and hitting the photodetector is directly proportional to the intensity in the aerial image for the given position. Image analyzer 52 correlates the output signal from the scanner of system 50 with x-y address information from the x-y translation assembly of system 50 to form an electronic representation of the aerial image created in image plane 32. As described here mailer, this electronic representation of the aerial image is analyzed by illumination controller 22 to optimize the illumination provided by light source 24.

It should be appreciated that the image scanning system 50 used in the present apparatus need not have a resolution as high as that required in other applications. A blurring of up to about 20% of the aerial image caused by the scanning system 50 would, in most cases, be acceptable here. In the present invention, the scanning system 50 provides image data only for the purpose of maximizing image slope. System 50 need not actually determine the numerical value of the slope, or more generally the "true" aerial image, with great precision.

In a second embodiment of projection imaging system 20, instead of scanning the aerial image at image plane 32, the aerial image is derived numerically by describing the optical projection system mathematically and computing the image using the known projector parameters and appropriate imaging equations. In the case of a projection imaging lens 30 having a NA (on the image plane side) of less than about 0.5 or 0.6, a scalar diffraction-based model is adequate. One such model was developed by H. H. Hopkins and is described in a number of papers, such as "Image Formation with Coherent and Partially Coherent Light," *Photographic Science and Engineering*, v. 21, #3, May/June 1977, p. 114, presented at the SPSE International Conference of Image Analysis and Evaluation, Toronto, Ontario, Canada, Jul. 19–23, 1977 and published by the Society of Photographic Scientists and Engineers (now called the Society of Imaging Science & Technology, or IS&T), Washington, D.C., 20037. The Hopkins model treats the electric field forming the image as a scalar and assumes the object being imaged is sufficiently thin so that its effect on the incident field is represented by a multiplicative function. It is advantageous to perform the image formation analysis in the Fourier domain (frequency space) in order to deal with the pupil function of the imaging system rather than the amplitude response function and with the angular distribution or "effective source" rather than with the mutual intensity. The pupil function $\tilde{H}(f,g)$ describes the imaging lens pupil shape and wavefront aberrations and can be measured interferometrically. The effective source $\tilde{J}(f,g)$ describes the angular illumination distribution and is mathematically simpler and more directly measurable than its Fourier counterpart, the mutual coherence. The object amplitude transmittance, given by $O(x,y)$, has a Fourier transform $\tilde{O}(f,g)$, which describes the spatial frequency content of the object.

For the spatial image irradiance or aerial image $I(x,y)$, the projector equation in the frequency domain, which describes the spatial frequency content of the image, is given by $$\tilde{I}(f,g) = \int df_1 df_2 dg_1 dg_2 \delta(f-f_1+f_2) \delta(g-g_1+g_2) \times \tilde{C}(f_1,g_1,f_2,g_2) \tilde{O}(f_1,g_1) \tilde{O}^*(f_2,g_2)$$

where $$\tilde{C} = \int df dg \tilde{J}(f,g) \tilde{H}(f+f_1,g+g_1) \times \tilde{H}^*(f+f_2,g+g_2)$$

with the superscript "*" representing the complex conjugate. $\tilde{I}(f,g)$ is then inverse Fourier transformed to obtain the spatial aerial image, $I(x,y)$. There are several computer programs commercially available that calculate aerial images based on the Hopkins model. Finle Technology, PO Box 162712, Austin, Tex., 78716, offers three different programs, Prolith/2,Proxlith/2 and Imagepro/2. The University of California at Berkeley, Department of Electrical Engineering and Computer Science, Berkeley, Calif., 94720, offers a program called SPLAT. In addition, Vector Technologies, PO Box 3020, Princeton N.J., 08543, offers a sophisticated aerial image calculation program called FAIM (Fast Aerial Image Model).

When the NA of projection imaging lens 30 (on the image plane side 32) is higher than about 0.6, a vector diffraction imaging model is preferred. This is because at high NA, the interfering electric field components of the radiation forming the image become significantly non-parallel and thus incapable of producing complete destructive or constructive interference. In addition, for photolithographic applications, the interaction of the polarized beam incident on a film stack at non-normal incidence may make it necessary to conduct illumination optimization based on the image formed within the film volume rather than with the aerial image per se for certain objects. A suitable vector diffraction imaging model is described by D.G. Flagello and A. E. Rosenbluth in the article "Vector Diffraction Analysis of Phase-mask imaging into Photoresist," presented at *SPIE* 1993 *Microlithography Conference*, San Jose, Calif., 1993. The Flagello-Rosenbluth vector imaging model contains several key assumptions. The first is that the lens provides stationary (isoplanatic) imaging over regions that are large compared to the imaging lens resolution. In addition, diffraction from the mask is modeled as a scalar process, so that the polarization is not appreciably changed upon diffraction from the object. The assumption is also made that meridional rays serve as an adequate model of the polarization behavior of light through the lens. As each ray emerges from the exit pupil, it will have a polarization amplitude for each Cartesian component that depends on the exiting direction and can be calculated trigonometrically. Further, the Debye approximation is used, which allows for the amplitude of plane waves constituting an angular spectrum of such waves converging onto the image plane to be approximated by rays emerging from the exit pupil with the same direction and amplitude. In a vector approach, each polarization of the ray must be considered. A family of coherent rays emerging from some point in the exit pupil can be considered to represent diffraction of a single illuminating beam by a particular spatial frequency in the object, and to have a common phase representing the lens aberration. If the optical axis coincides with the z coordinate, with x and y the transverse axes, the angular spectrum component of the electric field vector E propagating from the exit pupil with (x,y) direction cosines (a',b') gives rise to incident electric field plane wave components at the air/film interface given by $$[\tilde{E}_o(a',b')]_{qrl} = \frac{1}{m} \sqrt{\frac{c}{c'}} \; \tilde{O}(ma',mb';m)\tilde{T}(a',b') e^{ik_0 W(a',b')} [P(a',b')]_{qrl}$$

Here, q refers to the initial polarization of the electric field vector E at the source (x or y), r references the Cartesian E component incident at the image plane, and 1 indicates the coupling between the q and r components in either S or P polarization at the air/film interface. Also, primed and unprimed coordinates refer to the image and object spaces, respectively. $\tilde{T}$ ( a', b') is the transmission function of the lens. The exponential term describes residual aberration in terms of wavefront phase error W(a',b'). P(a',b') is the polarization projection function across the exit pupil. $\tilde{O}$ (ma',mb'; m) is the amplitude diffracted by the mask into object space directions a=ma' and b=mb', with m repeated as a separate argument to indicate that the diffractive properties of the mask object will in general change if the pattern reduction is changed. The term $(1/m)[c/c']^{1/2}$ is a radiometric obliquity factor needed to conserve power between the object and image space. Propagation of the plane waves into the film stack, if required, is carried out by standard thin-film matrix methods, such as described in the book by P. H. Berning, *Physics of Thin Films,* G. Hass, Ed. (Academic Press 1963), pp. 69–121. Integration of the above equation over the range of direction cosines a' and b', summing both S and P polarizations for a particular z value, gives the component image field amplitude E'(x',y',z'). The coherent irradiance for each initial polarization state is proportional to the sum of the component square magnitudes of the field, calculated by performing the following summation:

$$I_q(x,y;z) = \sum_{r=x}^{z} |[E'(x',y';z')]_{qr}|^2$$

The partial coherence case is treated by doing the above summation for discrete source points. In accordance with the above process and methodology, Flagello and Rosenbluth developed a computer program called Vector Imaging Code (VIC) to perform the numerical calculations, as discussed in their article referenced above. Such programming is normally required for all but the most trivial of imaging scenarios and can be readily accomplished by those skilled in the art. In addition, the aforementioned commercially available program FAIM includes a vector model which gives accurate aerial image results for high NA polarized illumination.

Referring to FIGS. 2 and 3, the optimization of illumination and subsequent setting of source 24 whether by actual scanning of the image or by numerical calculation of same, as discussed above, can be described in terms of three cases. In the first case, source 24 is controlled by illumination controller 22 so that each pupil pixel 40 may be addressed with any desired irradiance. On a normalized scale where the brightest illuminated pupil pixel 40 is 1 and an unilluminated (i.e., dark) pupil pixel is 0, such a system is designed to provide any irradiance between 0 and 1. For this first case, source 24 preferably comprises either a unitary point source that may be controllably scanned so as to illuminate selected pupil pixels 40 with illumination of desired intensity, or a cluster of point sources that are either moveable or are of sufficient density to permit selected pupil pixels 40 to be illuminated at a selected intensity. In the second case, source 24 may be controlled by illumination that addresses any pupil pixel 40, but provides only a normalized irradiance of 0 or 1. Alternatively, a relatively simple source 24 capable of providing such illumination can be obtained, at the expense of light loss, by flood exposing a custom aperture plate (not shown) placed in a plane 42 (FIG. 3) conjugate to the projection imaging lens entrance pupil 28. The custom aperture plate is constructed so that (1) an opening exists associated in position with each pupil pixel 40 having an irradiance value of 1 and (2) a solid, light blocking portion exists associated in position with each pupil pixel 40 having an irradiance value of 0. A library of aperture plates may be maintained for each image pattern to be generated. Unless the plate has graded transmittance, or unless many plates are sequentially exposed, such a system is only capable of providing an on/off switching at each pupil pixel 40.

In the third case, source 24 has restricted capabilities, in that it cannot address selected pupil pixels 40. Instead, source 24 generates selected geometric shapes that are imaged in entrance pupil 28. Although the intensity of the images created may be controlled, such control is effected on the gross image level and not on a pixel-by-pixel basis. Images may be created using flood illumination and an aperture plate with physical apertures to vary the illumination as discussed above. Alternatively in the third case, source 24 may comprise moveable fiber bundles, or an illuminator which addresses a roughly circular array of pixels in the pupil, with the radius of such array being adjustable. In this latter case, apparatus such as described in the '170 patent, which teaches varying the effective source distribution by the use of a variable magnification afocal system interposed between the primary source and an optical integrator, could be employed.

In all three cases, projection imaging system 20 must provide means for determining the optimum global configuration of the light to be imaged at entrance pupil 28, and hence which pupil pixels 40 are to be illuminated. In the first case, the optimum configuration is specified as a list of (a) pupil pixels 40 to be illuminated and (b) the normalized irradiance for each such pupil pixel. A similar list is made for the second case, except that the irradiances are restricted to either 0 or 1. In the third case, the optimum configuration is specified via different variables, usually fewer in number, such as aperture fill radii or (x,y) fiber bundle coordinates, which are related in a simple but non-linear way to the point source irradiance values. In all three cases, entrance pupil 28 may be divided into any convenient number of pupil pixels 40, e.g., 40–2000 pixels. The extended source comprising the irradiance values which produce the optimum wafer image for a given mask or masks is a list or vector hereinafter referred to as $\vec{S}$.

An important aspect of the present invention is the technique for generating the list of pupil pixels 40 to be illuminated and the intensity of illumination of such pixels, i.e., the technique for optimizing the illumination of source 24. As described hereinafter, and as illustrated in FIGS. 4a–4c, the technique for optimizing illumination is identical for each of the three cases described above, except for the final step of the technique (involving the minimization of a set of matrix products), as described hereinafter.

Figure 4A:
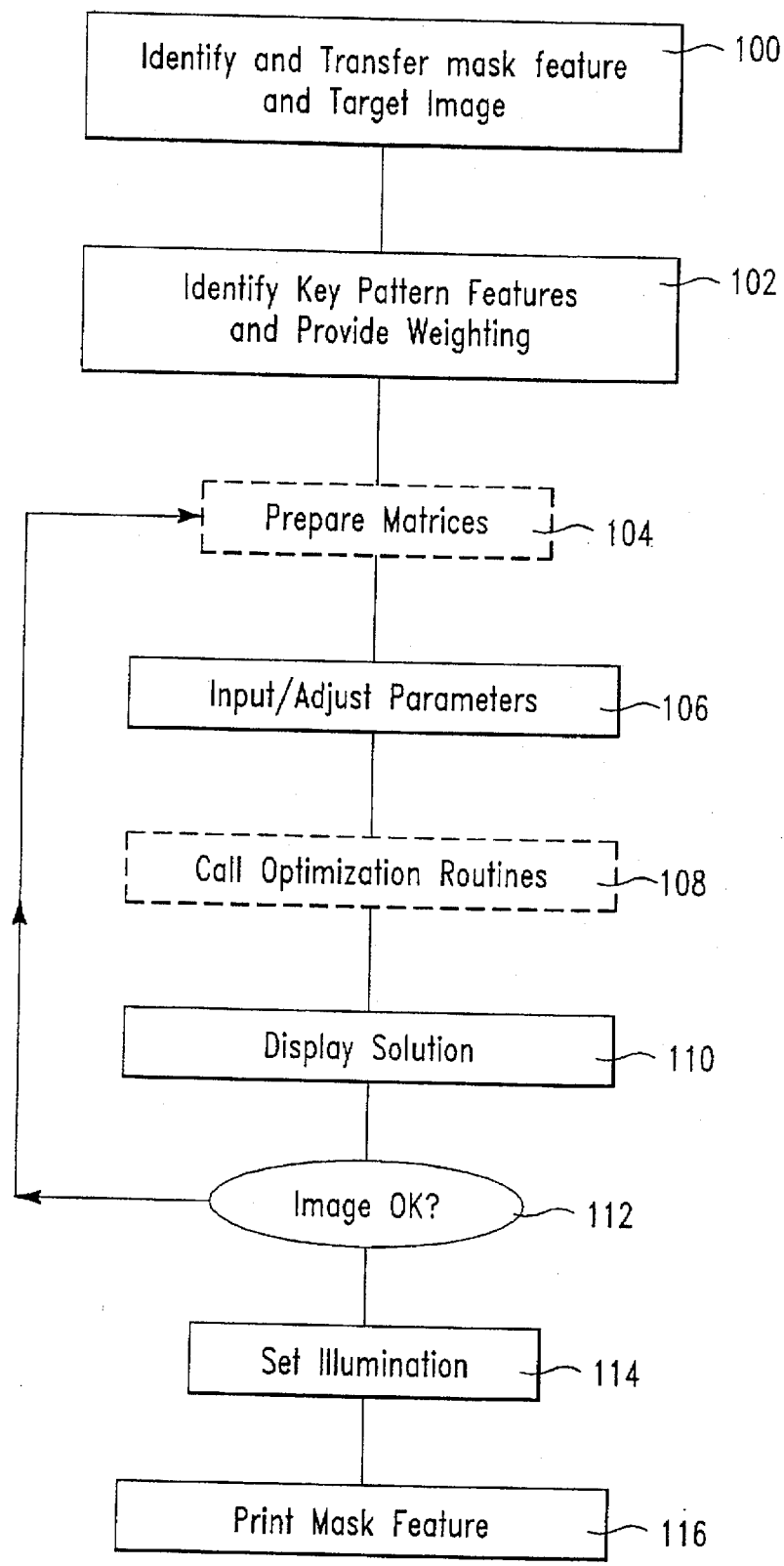
FIG. 4a is a flow chart of the general methodology involved in deducing and setting the optimum illumination, based on user input.
Figure 4B:
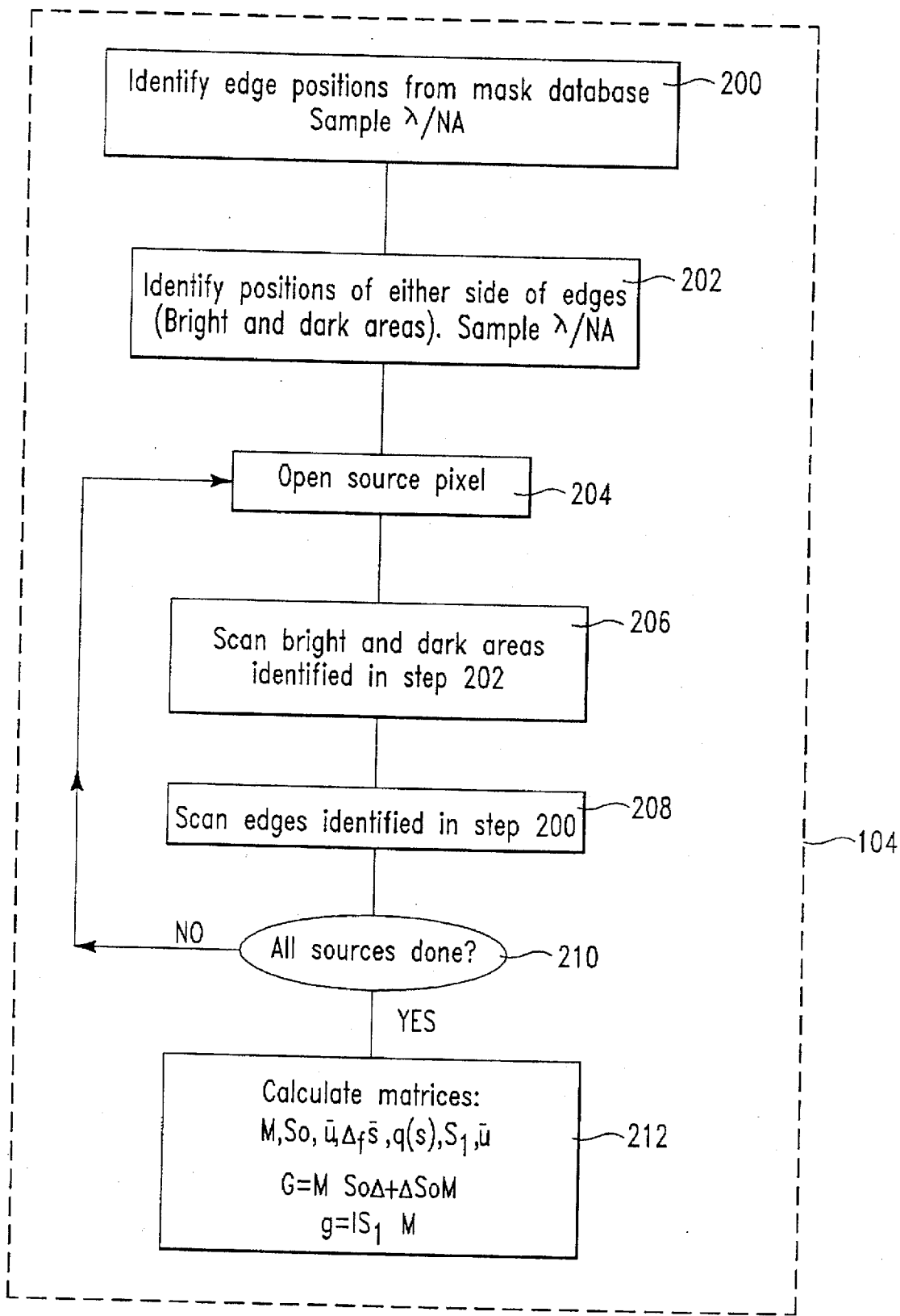
FIG. 4b is a flow chart of the methodology involved in forming and evaluating optimization matrices used for defining the illumination.
Figure 4C:
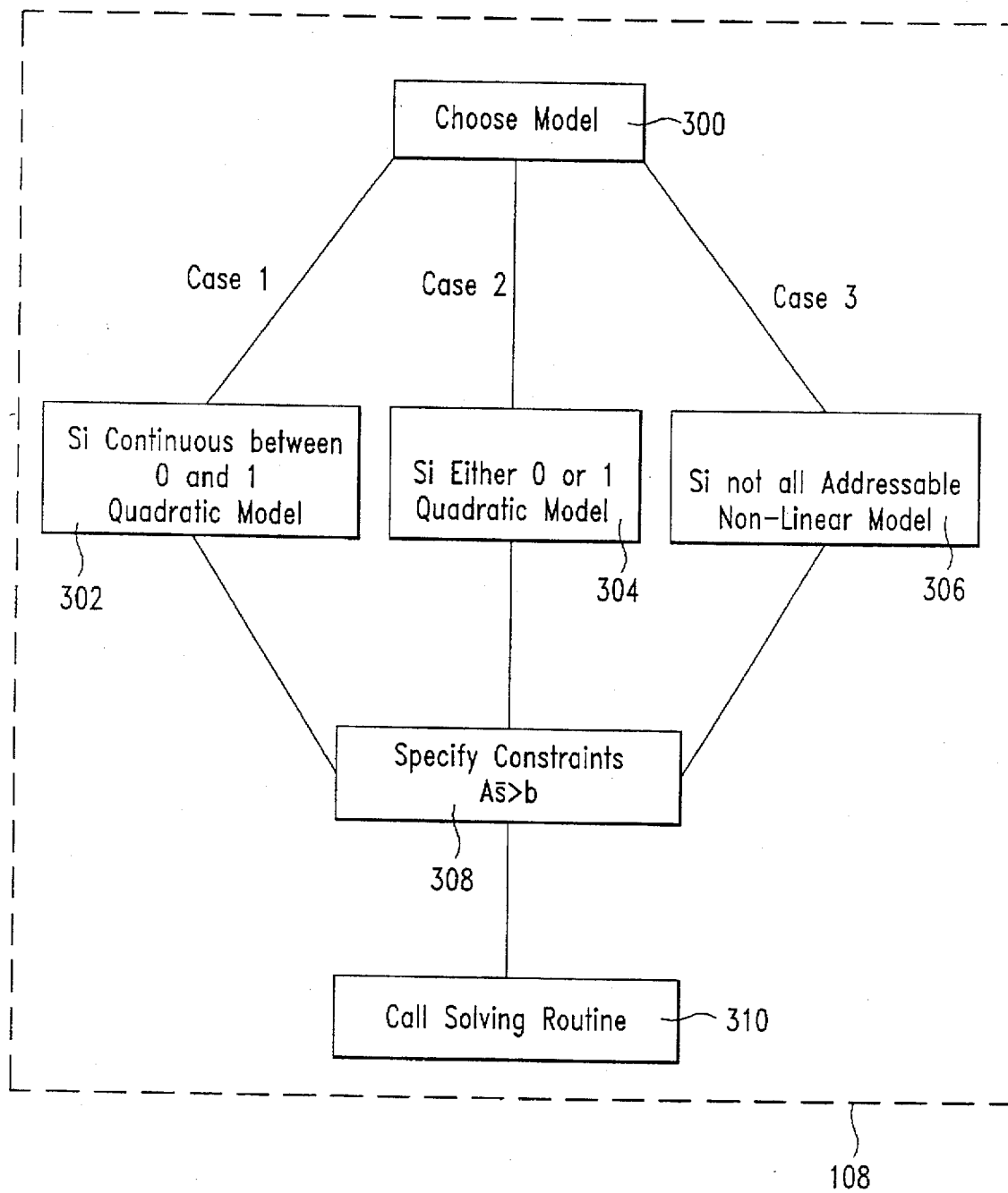
FIG. 4c is a flow chart of the methodology used to invoke a solving routine depending on the degree of illumination control required.

The first step in the general procedure for finding the optimal illumination, illustrated in FIG. 4a, step 100, is to identify the mask (or reticle) feature or features required to be imaged by projection imaging system 20, along with a target image, and input the information into illumination controller 22. The target image is defined as the aerial image irradiance distribution that is ultimately desired. In most cases, the target image pattern is simply identical to the mask feature (or, more precisely, the mask feature's irradiance transmission). However, there may be situations where it is preferable to optimize to a target image that is different from the mask feature, such as when the mask feature is of a particularly complicated shape, if there is a portion of the feature whose resolution is particularly critical, or if the invention is used in conjunction with phase-shift masks. When this is the case, the target image information needs to be included as part of step 100. The ability to define a desired target image allows for wide latitude in finding an illumination to suit a variety of objective and subjective imaging needs, such that the "optimal" illumination refers to that illumination which provides an aerial image closest to the target image.

When the target image pattern is just the mask feature itself, the necessary information for step 100 may be obtained from conventional electronic mask design databases. Such databases typically store the pattern in digital form as a series of square pixels (hereinafter referred to as mask pixels) laid out in a rectangular grid. Most commonly, the database information in effect specifies which mask pixels are clear and which are opaque. The mask feature (and hence, target image pattern) can always be described with such a specification in terms of exposed and unexposed regions. Traditionally, in order to be written on the mask blank, the feature is divided up into pixels by applying a step known as postprocessing, and is encoded in the design database. In today's technology, typical widths of individual mask pixels are about 0.25 µm to 0.5 µm, but narrower pixels such as 0.125 µm might be specified to accommodate patterns with non-x,y orientation or a curved perimeter. These mask pixels are often demagnified by 4X or 5X when projected on the wafer.

Thus, as indicated by step 100, FIG. 4a, the object and target image patterns are identified and then transferred, preferably in electronic form, to illumination controller 22 from the source where such patterns are stored, e.g., a mask database. Next, at step 102, the user has the option of identifying key pattern features, and providing numerical weights to emphasize those features which are deemed particularly crucial, as described in more detail hereinafter. Typically, the key pattern features to be identified will be those features having a size and/or configuration approaching the resolution limit of the projection imaging system. This weighing option can be used in combination with a target image pattern that is the mask feature itself, in lieu of having to resort to a target image pattern that differs from the mask feature.

Illumination controller 22 then prepares matrices that are used in determining the optimum illumination to be generated by source 24, as indicated by step 104. The operations performed at step 104 are described hereinafter and are illustrated in the more detailed flow diagram of FIG. 4b.

The matrices prepared at step 104 contain information pertaining to the image formed at image plane 32. As the first step in generating this information, step 200 in FIG. 4b, a convenient number of sample positions, such as about four, or such as about one per each $\lambda/NA$ step, are chosen along the edge extending between each pair of adjacent corners, which edge separates dark pixel regions from bright pixel regions in the desired image. These sample positions are defined by (x,y) coordinates generated based on the (x,y) coordinates of the selected corners and edges which are known from the mask database. Next, at step 202, (x,y) coordinates of additional sample points located on either side of the edges are calculated. Once again, a convenient number of sample positions is chosen on each side of the edges, e.g., about four, or about one per each $\lambda/NA$ step. It may be convenient to locate these sample positions at about 0.5 $k_1\lambda/NA$ away from the edge, where $k_1$ refers to the minimum width feature in the pattern. An additional set of sample points at a distance of about $k_1\lambda/NA$ can be further used to identify bright and dark areas, for those patterns that are wider than twice the minimum $k_1$.

As the next step 204, a single pixel 40 (FIG. 2) or group of such pixels in entrance pupil 28 is addressed with illumination. Then, as indicated in step 206 and 208, the bright and dark areas of the feature image (step 206) and the edges of the mask feature image (step 208), the locations of which were defined in step 200 and 202 respectively, are scanned using image scanning system 50, or alternatively, are calculated numerically using image analyzer 52. As indicated by query step 210, the steps 204 through 208 are repeated until all the pixels or regions of pixels are addressed with illumination.

Finally, in step 212, the information collected in the illuminating and scanning steps 204 through 208 is used to create several matrices used for performing the optimization calculation. One matrix that is generated in step 212 is a matrix M, whose nth column is simply a list of the wafer plane irradiance values that were measured when the nth source pixel was illuminated. Additional measurements or calculations are made of the image slope $\eta\nabla I$ at those sample points that lie on feature edges (step 208). Here, $\eta$ is the unit vector in the direction perpendicular to the feature edges, $\nabla$ is the gradient operator, and I, as defined earlier, is the aerial image irradiance distribution. A row is added to M for each such sample position, the elements of the row being the measured slopes.

Also in step 212, the vector $\vec{s}$ containing the optimum source intensities is introduced and is used to define matrices. Given M, the list or vector $\vec{u}$ of optimized wafer intensities and edge slopes is defined by the relation $\vec{u}=M\vec{s}$. If desired, the matrix M can be pre-multiplied by a diagonal matrix whose elements are user-input weights, as described above, relative to step 102, FIG. 4a.

One goal in optimizing the image is to have a constant intensity along the desired perimeter of the circuit features. This makes it possible to adjust the lithographic process in such a way that the resist images are developed out to this target perimeter. This goal cannot be satisfied perfectly, due to the finite resolution of the lens, but can be approximately satisfied in the following manner. The image analyzer 52 generates a matrix $S_O$ in step 212 that selects those sample positions in $\vec{u}$ which lie on feature edges identified in step 200. Columns of $S_O$ corresponding to such edge sample positions contain a single 1, with the remaining elements set to 0. If the $m^{th}$ sample position does not lie on an edge, but instead falls within a light or dark area, then the $m^{th}$ column of $S_O$ is filled entirely with 0's. Each row of So contains a single 1. Similarly, matrices $S_{dark}$ and $S_{bright}$ are constructed as arrays of 1's and 0's that select the dark and bright sample areas identified in step 202. Thus, for example, for a given column in matrix $S_{bright}$, which corresponds to a given sample position, all the rows in the column would consist of 0's unless there is a bright region on one side of the edge (for the given sample position). The row in the given column corresponding to this bright region would consist of a 1. Matrices $S_{dark}$ and $S_{bright}$ are used in the inequality constraint identified in Step 308 of FIG. 4b, as discussed hereinafter.

Once the edge intensities in $\vec{u}$ are selected by $S_O$, the variation in intensity along the perimeter, $(S_O\vec{u})-\bar{u}$ is then selected through a matrix $\Delta$, also calculated in step 212. Here, $\bar{u}$ represents the average intensity along the perimeter. As a simplified example, if we suppose that 4 edge elements from $\vec{u}$ have been selected by $S_O$, then $\Delta$ would operate on $\vec{u}$ as $$(S_0\vec{u})-\bar{u}=\begin{bmatrix} .75 & -.25 & -.25 & -.25 \\ -.25 & .75 & -.25 & -.25 \\ -.25 & -.25 & .75 & -.25 \\ -.25 & -.25 & -.25 & .75 \end{bmatrix}\begin{bmatrix} u_1 \\ u_2 \\ u_3 \\ u_4 \end{bmatrix} \equiv \Delta S_0\vec{u},$$

so that the $i^{th}$ row of $\Delta$ returns the deviation of the $i^{th}$ element of $\vec{u}$ from the average of all four perimeter elements.

Finally, to minimize the variation in intensity along the target perimeter of circuit features, the quantity $$\Sigma((S_0\vec{u})-\bar{u})^2 = \vec{s}^T(M^TS_0^T\Delta^T\Delta S_0M)\vec{s}\equiv\vec{s}^TG\vec{s}$$

is minimized. The superscript T is used here to represent the transpose of a matrix.

Resolution in photolithographic applications depends on the sharpness of the image, which can be defined in terms of the edge slope of the aerial image irradiance distribution. Thus, another goal in optimizing the primed patterns is to obtain maximum slope in the image $\vec{u}$. To do this, a matrix $S_1$, analogous to $S_0$ is added in step 212, which selects the slope entries from $\vec{u}$. It is convenient to define $S_1$ to return the negative of the slope with the desired sign, so that the negative slope can be minimized. A parameter $\alpha$ is added to balance the impetus towards steeper slope with the quantity described above that specifies uniformity along the perimeter. Thus, the overall goal is to find the vector $\vec{s}$ (the illumination) that minimizes the quantity q (the difference between the actual aerial image formed by illumination $\vec{s}$ and the target aerial image), where q is prepared in step 212 and is given by $$q(\vec{s})=\vec{s}^TG\vec{g}+\alpha(IS_1M)\vec{s}\equiv\vec{s}^TG\vec{s}+\alpha\vec{g}^T\vec{s}. \quad [1]$$

The matrix g, also generated in the matrix forming step 212, is the product of $S_1$ and M, premultiplied by a vector of 1's, denoted I, which carries out a summation, i.e., it takes an average.

Referring again to FIG. 4a, the next step 106 involves inputting and then subsequently adjusting certain parameters used in the optimization routines of step 108 (described below), in order to achieve the most satisfactory image.

When finding the optimum F, an important physical constraint is that all the source intensities be non-negative. In addition, when optimizing illumination patterns for very narrow width, such as $k_1 < 0.5$, or when optimizing patterns in defocused planes, it is also preferable to include constraints that force the image to have proper topology. First, it is required that the image be dimmer than the resist threshold $T_{resist}$ at pixels in the middle of the dark area, and second, that the intensity be above some complementary threshold $T_{expose}$ in the bright areas. Thus, the two key parameters that are inputted or adjusted as part of step 106 are $T_{expose}$, $T_{resist}$.

Methods for finding the minimum of q (Eq. 1), as called for in step 108, FIG. 4a, are well known to those skilled in the art. Referring now to FIG. 4c describing step 108 of FIG. 4a in more detail, step 300 calls for choosing one of three available models, depending on the type of illumination. Step 302 pertains to the first illumination case (case I), where the elements of $\vec{s}$ are continuous in the interval between 0 and 1. This type of minimization is a so-called quadratic programming problem, as described by R. Fletcher in *Practical Methods of Optimization, vol. 2, Constrained Optimization*, Wiley, 1981. There also exists computer software, such as IBM's Optimization Subroutine Library (OSL), as described in *IBM Systems Journal*, vol. 31, no. 1, 1992 (IBM publication #sc23-0519-03), which contains routines that will return the optimum q in this case, and will return the global optimum q so long as Eq. 1, above, is convex. Thus, in calling optimization programs as per step 108, the quadratic model of step 302 in FIG. 4c would be specified in this case.

Step 304 of FIG. 4c pertains to the second case (case 2), where the elements of $\vec{s}$ are either 0 or 1. This is an example of a so-called binary mixed integer problem, also described by Fletcher. Routines are available to solve such mixed integer problems, but the quality of the solution can be significantly influenced by the choice of initial trial solution. A suitable initial solution is obtained by thresholding the solution obtained for the first case, setting all addressed pupil pixels between 0.5 and 1 to unity, and setting to zero all addressed pupil pixels below 0.5. An alternative when the number of pupil pixels is sufficient, such as about 300 or more in each quadrant, is to derive a solution for the second case by half-toning the resulting solution calculated from the first case. Thus, in calling the optimization programs as per step 108, the quadratic model of step 304 of FIG. 4c would be specified in this case.

Step 306 involves finding a solution for q for the third case (case 3), where certain pupil pixels are not addressable, and requires more of a brute force approach. Specific methods are described, for example, by M. Avriel in *Nonlinear Programming*, Prentice Hall, 1976. Fortunately, the demerit function in Eq. 1, obtainable with the apparatus described herein, can be evaluated quite rapidly, given its simple matrix form. This, together with the small number of variables typically encountered in this case, makes an exhaustive search of the parameter space to find a solution quite feasible. Thus, in calling the optimization programs as per step 108, the non-linear model of step 306 of FIG. 4c would be specified in this case.

After the appropriate illumination case and corresponding optimization routine is identified in step 108 (as being either step 302, 304 or 306), the parameters defined in step 106 are combined in step 308 (of step 108) to specify the inequality constraint, $$A\vec{s} \geq \vec{b}$$

or, writing $\vec{A}$ and $\vec{b}$ in more detail, $$\begin{bmatrix} \text{Identity matrix} \\ -S_{dark} \times M \\ +S_{bright} \times M \end{bmatrix} \vec{s} \geq \begin{bmatrix} 0 \\ -T_{resist} \\ +T_{expose} \end{bmatrix}$$

A fourth constraint can be added at this point, namely that the sum of the $s_i$ (the elements of $\vec{s}$) be 1, but it is usually preferable to dispense with this through proper normalization of the other parameters.

Once steps 300 through 308 are performed, the next step, 310, is carried out, which calls the appropriate solving routine, as described above, for the illumination case identified in step 300. Once an $\vec{s}$ is found by the solving routing called in step 310 (thus completing step 108 in FIG. 4a), as the next step, 110, FIG. 4a, it is useful to display and examine the aerial image formed by the illumination defined by $\vec{s}$. In this step, it is preferable to display a numerically calculated aerial image, since it may take several iterations to adjust the parameters initially set in step 106 and would likely prove more time consuming if the actual image has to be scanned for each iteration. If the image displayed is not entirely suitable, say for example, the irradiance contours do not correspond closely enough to the target aerial image, then the query step 112 ("Image OK?") would be answered in the negative, and the input parameters are adjusted as per step 106. Then, the steps 302 through 310 (i.e., all the steps comprising step 108) are repeated until the query step 112 can be answered in the affirmative. Once the query step 112 is answered in the affirmative, the illumination source 24 (FIG. 1) is then set by the illumination controller 22, as per step 114, to provide, what at this point, is the optimum illumination defined by $\vec{s}$. Then, as the final step 116, reticle 26, e.g., a mask, is exposed with such illumination to print the reticle feature in a radiation-sensitive medium, e.g., a semiconductor wafer coated with photoresist, conjugate the reticle.

Figure 5:
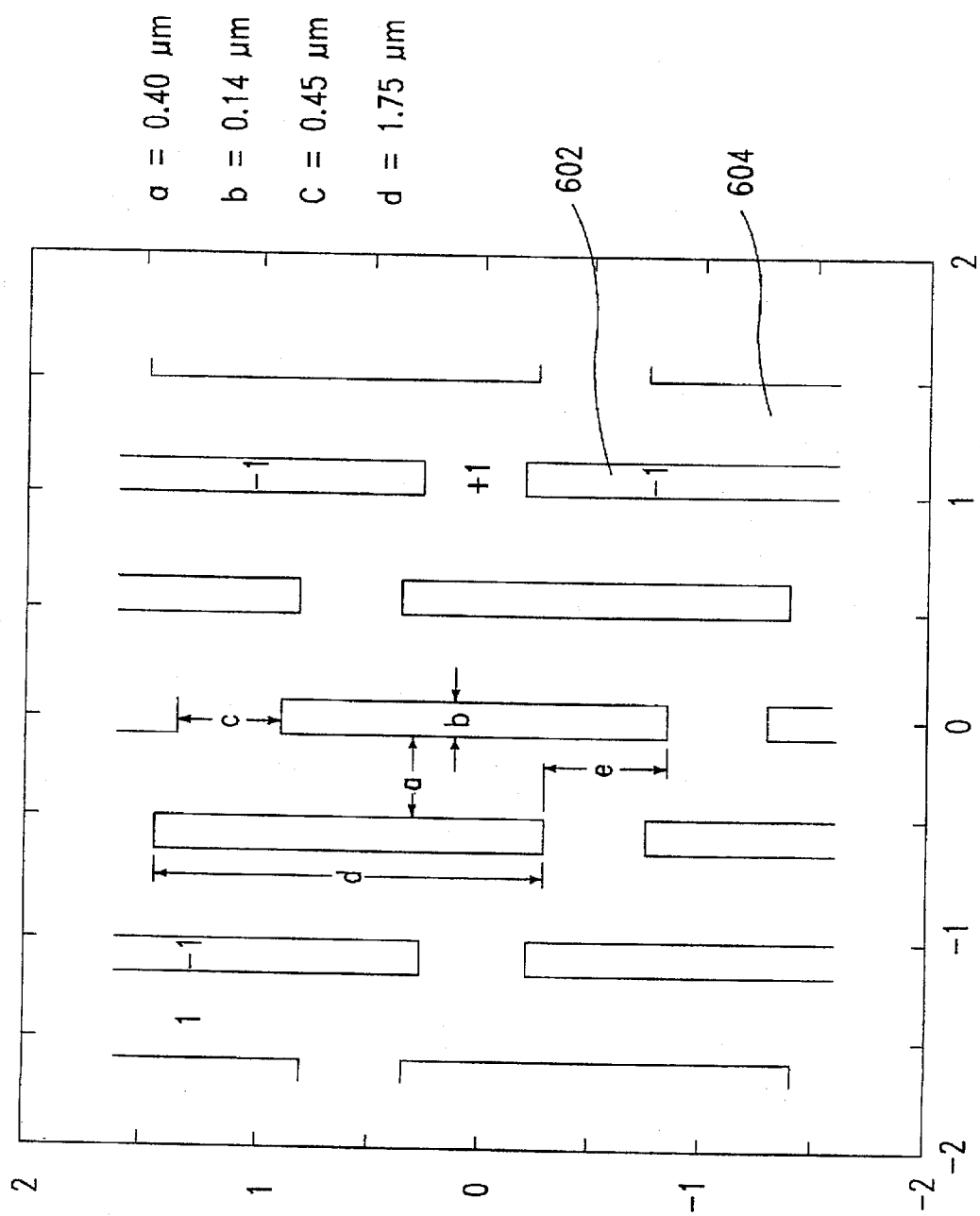
FIG. 5 shows a phase-shift mask containing features that might be found in a future generation memory IC.
Figure 6:
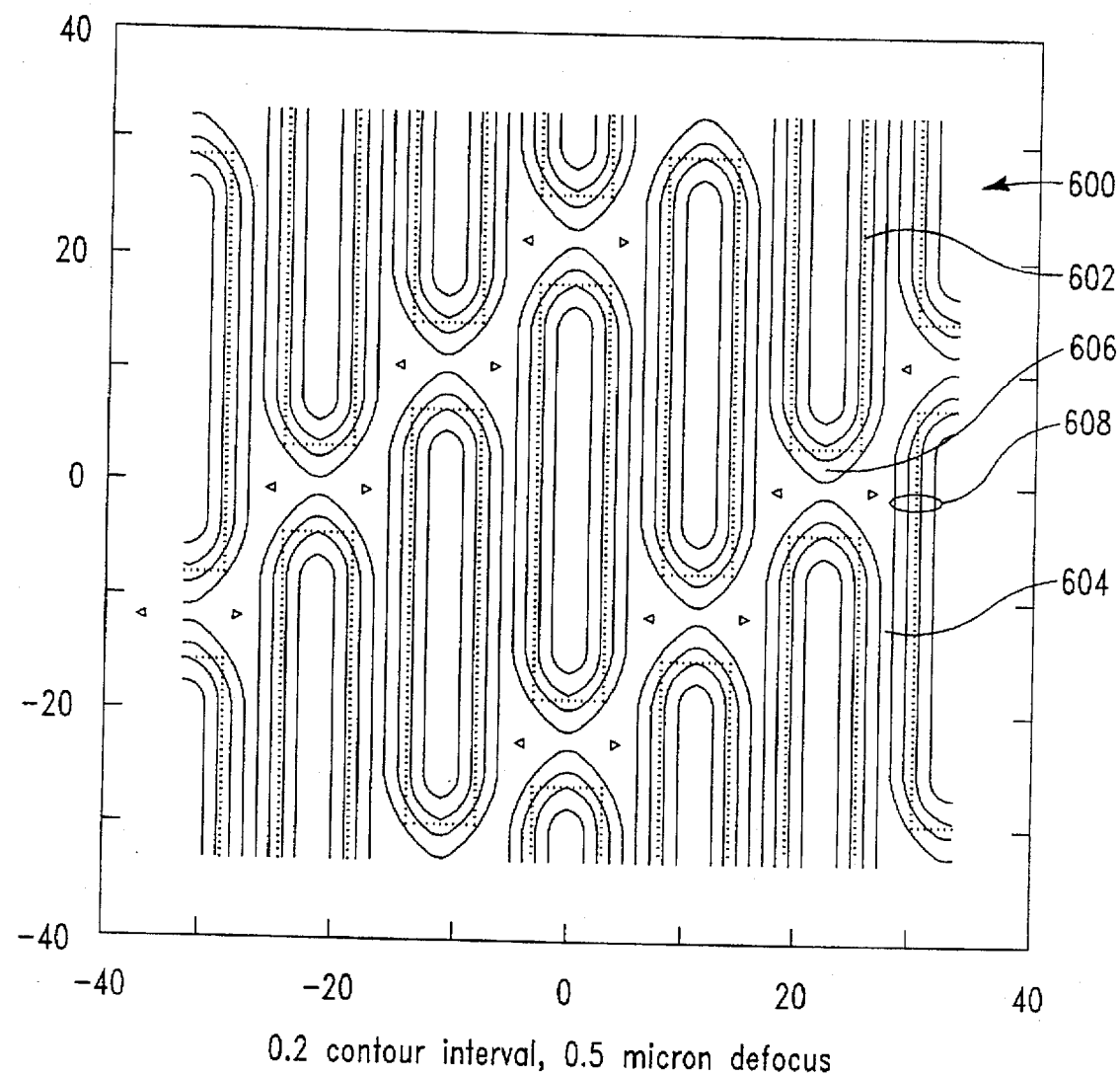
Figure 7:
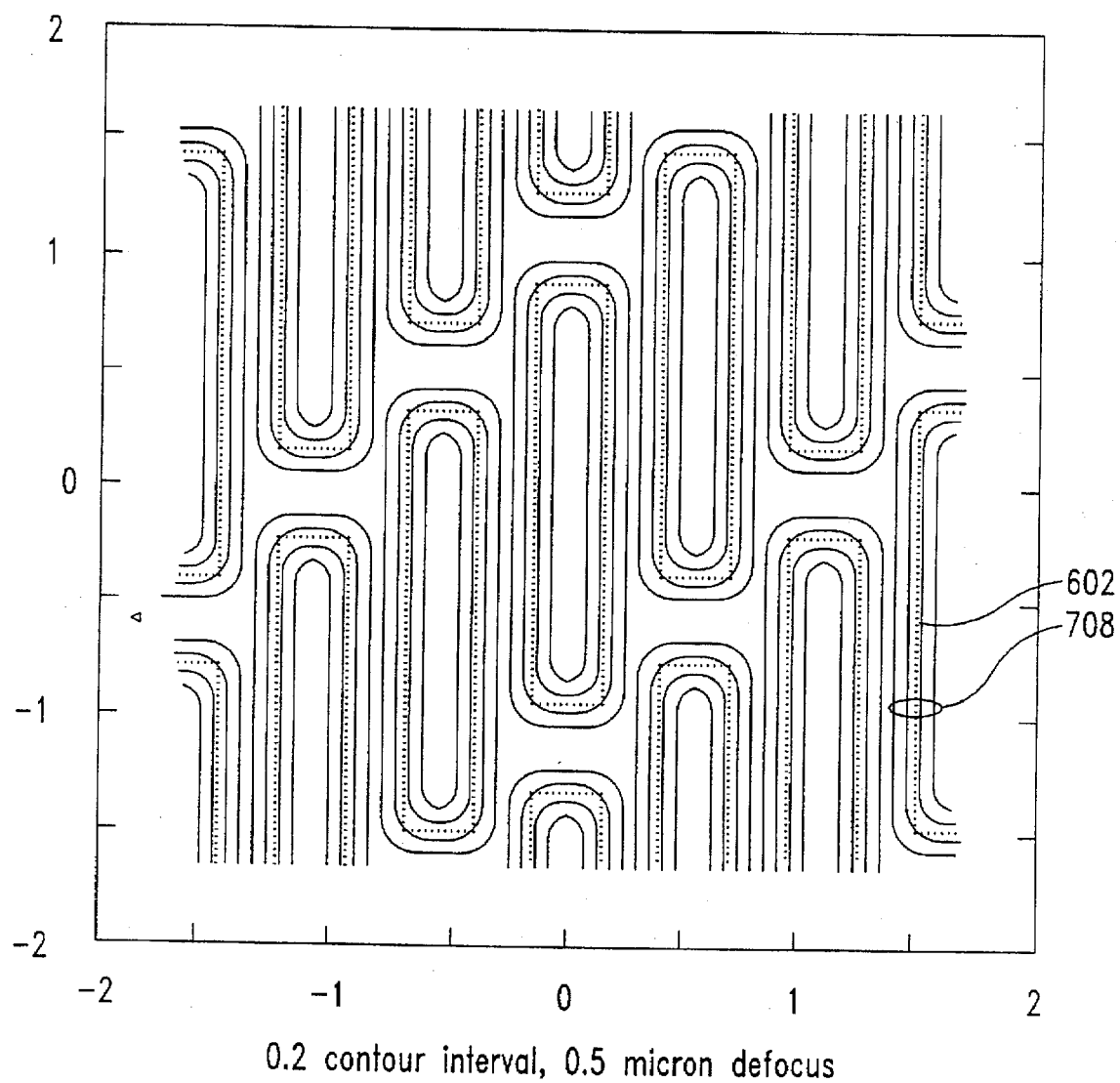
FIG. 7 shows aerial image irradiance contours of the phase-shift mask of FIG. 5, based on computer simulations generated for the source distribution shown in FIG. 8b.

The improvement in resolution obtainable by customizing the illumination in accordance with the present invention is illustrated in FIGS. 5 through 7. FIG. 5 is a phase-mask object that represents in a generic way the kind of structures that might be found in a future generation memory chip. The specific dimensions and phase values of the array of rectangles 602 in FIG. 5 were determined through application of the mask-design groundrules disclosed by T. Brunner in the article "Rim Phase-Shift Mask Combined with Off-Axis Illumination: a Path to 0.5 λ/NA Geometries," *SPIE Proceedings, Vol. 1927—Optical/Laser Microlithography*, J. Cuthbert, Ed. (Society of Photo-Optical Instrumentation Engineers, Bellingham, Wash., 1993), pages 54–62. All regions of the mask have unit irradiance transmittance, but the regions labeled "−1" are phase-shifted by 180 degrees, so that their amplitude transmittance is −1.

FIG. 6 shows equi-spaced 0.2 normalized irradiance contours of a numerically calculated aerial image 600 of the phase-mask object of FIG. 5. The dashed lines in FIG. 6 represent the rectangular object 602 of the phase-shift mask object of FIG. 5, and serve as the target aerial image. The rectangular objects 602 of FIG. 5 that are actually used on the mask are biased inwardly (i.e., are narrower) relative to the target image, as disclosed by Bruner in the above-cited reference. The target irradiance in the interior of rectangles 602 is 0 (dark) while the surrounding areas have a target irradiance of 1 (bright).

Figure 8A:
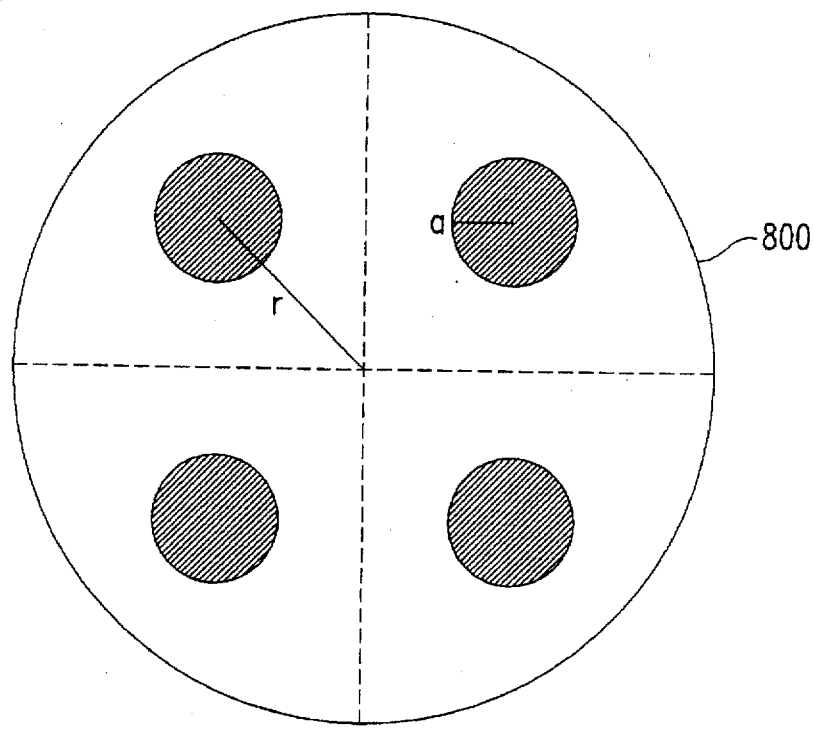
FIG. 8a illustrates the irradiance distribution of the source which is imaged into the entrance pupil of the projection imaging lens to create the image in FIG. 6.

The projection imaging lens assumed for the calculations has a wafer-side NA of 0.5, an operating wavelength of nominally 248 nm, and is free of optical aberrations. The gap 604 (FIGS. 5 and 6) across the widths of adjacent rectangles 602 is a $k_1$=0.5 feature for this lens. The image plane 32 (FIG. 1) has been displaced 0.5 µm from the position of best focus in order to simulate performance under the type of focal deviation likely to be encountered in practice. The illumination source is a standard Canon "C-Quest" quadruple 800 illustrated in FIG. 8a. This source is known to be suited to the fabrication of equal line/space patterns, and the image shows reasonably good contrast in alternating light/dark slices across the widths of the rectangles 602. Moreover, as disclosed by Brunner in the reference cited above, a synergistic benefit obtains when a quadrupole illumination is used in conjunction with the phase-shift mask of the type shown in FIG. 5. Despite this benefit, the equi-irradiance contours 608 in FIG. 6 are rounded across the ends of the rectangles 602, indicating that the contrast there is not very good.

Referring now to FIG. 7, the object, imaging plane and projection imaging lens is the same as for FIG. 6, but the illumination pattern in the imaging lens entrance pupil has been changed from pattern 800 (FIG. 8a) to that of pattern 802 (FIG. 8b), in accordance with the procedure of the present invention described above.

Figure 8B:
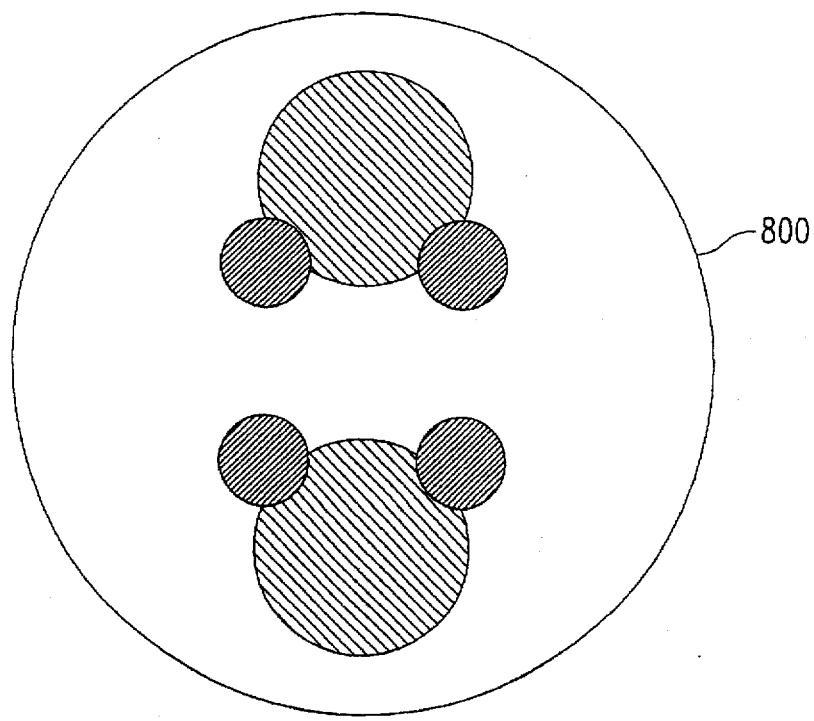
FIG. 8b illustrates the irradiance distribution of the source which is imaged into the entrance pupil of the projection imaging lens to create the image in FIG. 7.

More particularly, a case 3 optimization was carried out, with some steps done by hand. The starting solution was a set of four source points (i.e., disks with very small radii), arranged in x-y mirror symmetric fashion, as described above. A second pair of source points (of stronger irradiance than the first set) was positioned in mirror symmetric form along a horizontal axis. A non-linear optimization was then performed with the disk radii and positions of the source points as free parameters, and the rectangles 602 serving as the target image. As can be seen from the rectangular shape of the equi-irradiance contours 708 (FIG. 7), the source provides high contrast across both the width and ends of rectangles 602, the critical edges in the pattern. It is important to note that it is not immediately obvious that the shape of the illumination pattern 802 would provide such a drastic improvement in the aerial image 708 relative to the target image 602. In fact, the optimized source shape of FIG. 8b is somewhat unexpected, and does not fall into any of the source categories (disks, annuli, and quadrupoles) that are presently familiar to those skilled in the art. The present invention provides a ready means for finding such optimal illumination. In addition, aerial image 708 was created using illumination pattern 802 (FIG. 8b) comprised of superimposed disks with normalized irradiance values of only 0 or 1 (case 3 illumination), and that even further improvement in the aerial image 708 can be achieved by performing a case 1 optimization, whereby the pixels 40 (FIG. 1) comprising illumination source 802 can range anywhere from 0 to 1 in normalized irradiance.

There are several refinements of the present invention that may be used to achieve additional imaging advantages over the prior art. One such refinement involves extending the depth of focus. To this end, $\vec{u}$ is lengthened by, say, twice as many elements, in order to include data taken in two or more focal planes. The number of rows in M must be correspondingly increased in order that the image data for the new focal planes be included. Alternatively, if the submatrices of M representing the different focal planes are summed (leaving the length of $\vec{u}$ unchanged), a new matrix M is obtained that is suitable for the so-called FLEX technique as described in the patent by H. Fukuda, N. Hasagawa, T. Tanaka, and T. Kurosaki, *Method of Forming Pattern and Projection Aligner for Carrying out the Same*, U.S. Pat. No. 4,869,999, issued Sep. 26, 1989, in which images in multiple focal planes are superimposed on a wafer. The present invention also allows the FLEX method to be extended. Formally, this is accomplished by using the image data from defocused planes to increase the number of columns in M, instead of the number of rows. If the length of the source vector $\vec{s}$ is then increased accordingly, each focal component of the FLEX sequence can have independently optimized illumination.

Figure 9A:
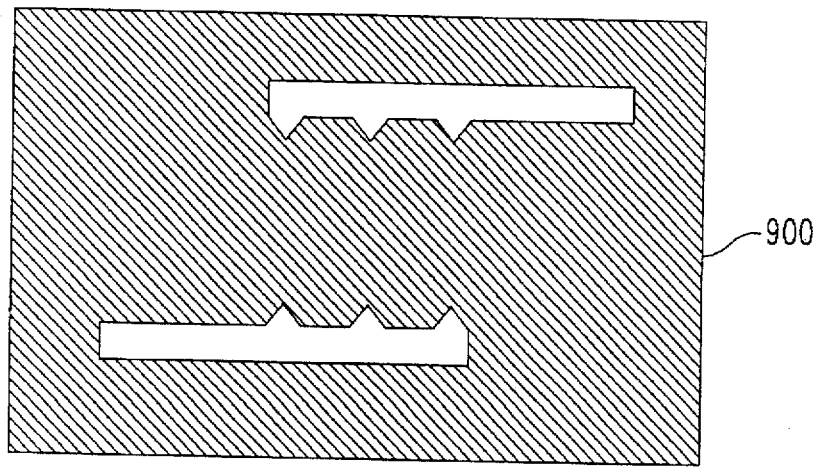
FIG. 9 illustrates two different masks that can be used to form the single resist image illustrated at the bottom of the Figure by overlaying the masks in sequential exposures.
Figure 9B:
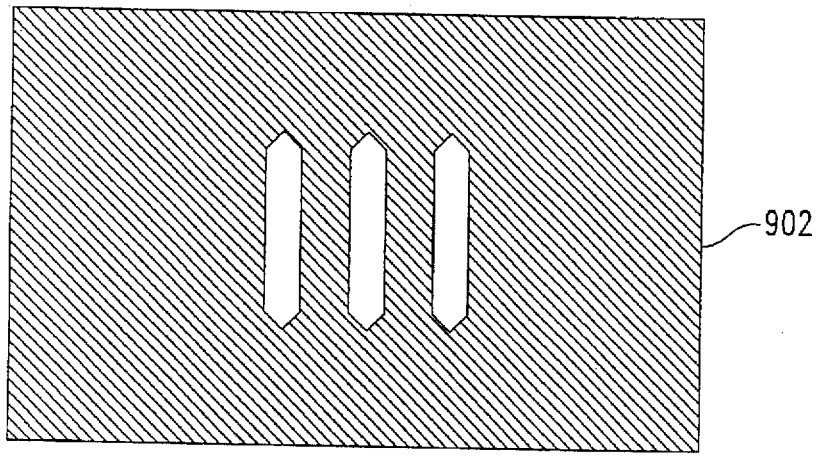
Figure 9C:
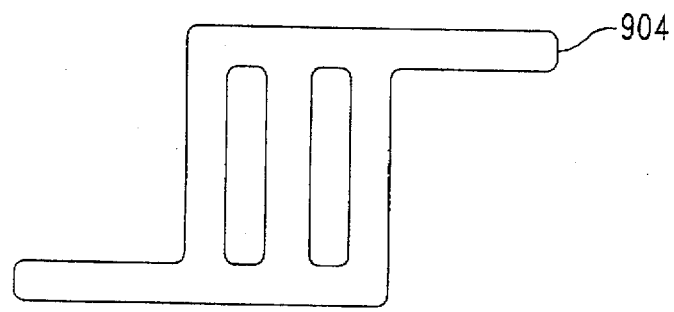
Figure 10A:
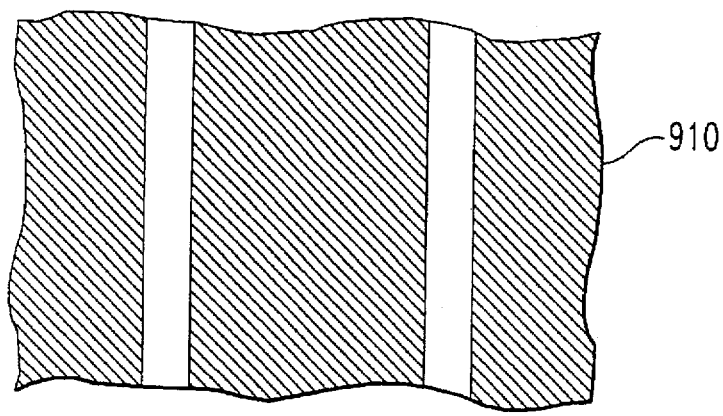
FIG. 10 is similar to FIG. 9, except that the two masks consist of orthogonally oriented grouped lines that can be double exposed to form the resist rectangles illustrated at the bottom of the Figure.
Figure 10B:
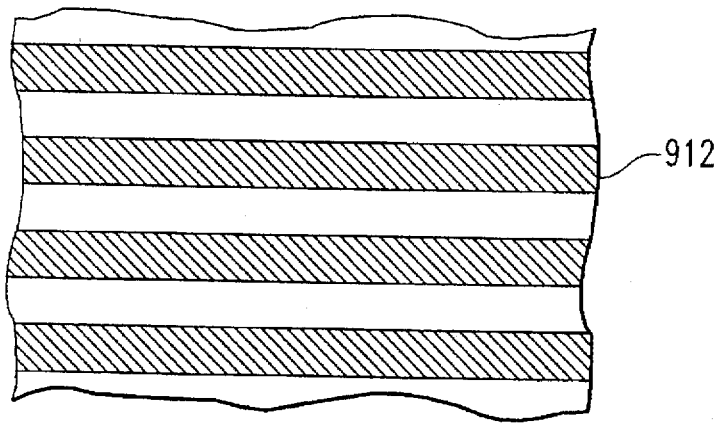
Figure 10C:
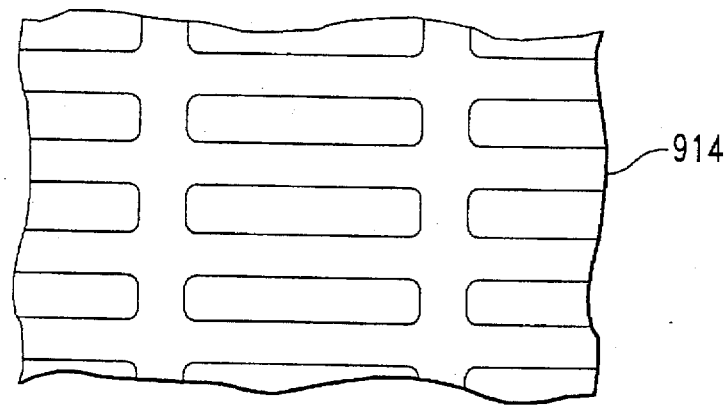

Another refinement of the present invention, which results in changes to M, (described below), involves dividing the desired wafer patterns among more than one mask, most conveniently two different masks, or two sequentially illuminated areas on a single mask. Such a technique, for conventional lithographic systems, has been described by H. Sewell, "A new dimension in phase-shift mask technology," presented at *SPIE Microlithography* 1993, San Jose, Calif. The present invention allows such techniques to be extended, as illustrated in FIGS. 9 and 10. If the exposures from the individual bright features on these different masks do not overlap on the wafer, but instead print as completely separated patterns, then each mask exposure can be dealt with independently, as per the above described system. To obtain the optimized illumination for such overlapped double exposures, the length of $\vec{s}$ can be doubled so that each half specifies the optimum illumination for one of the masks. The number of columns in matrix M is also doubled to accommodate the calculations or measurements for each mask. In this way independently optimized illumination for patterns in a chip kerf versus patterns in the primary circuit array can be realized.

Alternatively, there are many cases in which it would be desirable to butt the exposures from the two mask sets. FIG. 9 illustrates schematically how such an exposure might be accomplished, with a first mask 900 exposed with optimum illumination, using the procedures described above, then a second mask 902 aligned to the first exposure and exposed with an optimum illumination different from that used in the first exposure, also using the optimization procedures described above. The resulting wafer image resulting from the superimposed images is represented by 904, FIG. 9.

H. Jinbo and Y. Yamashita of OKI Corporation have proposed another use of overlapping exposures, in which negative-tone contact holes are printed by superimposed exposures of x and y oriented phase edges, as described in their article "0.2 Micron or Less Mine Lithography by Phase-Shifting Mask Technology," *IEDM* 1990 *Technical Digest*, p. 825, published by IEEE, 1990. A related idea is to overlap exposures of x and y oriented grouped lines in order to print rectangles, as illustrated in FIG. 10, where mask feature 910 is imaged with optimal illumination, and then mask feature 912 is imaged with optimal illumination different from that used in the first exposure to create the superimposed image 914. Here, too, optimal illumination for features 910 and 912 is determined in accordance with the procedures described above.

The present invention, as described above, is a method for determining and setting the optimum illumination directionality in a photolithographic projection system. However, it is to be appreciated that the particular methodology and application as it pertains to optimizing illumination may be used for purposes other than photolithographic projection printing. For instance, the present invention may be used for optimizing illumination for optical inspection, or other applications of optical projectors which employ the process of illuminating from a multiplicity of locations (or equivalently, directions) and optimizing the source distribution based on a superposition of illuminating positions (directions).

The present invention has several advantages over the prior art. One such advantage is that the present invention allows for the best possible illumination to be determined and then used for a given reticle feature and optical projection system. In addition, the best possible illumination can be used as the basis for determining and setting the "next best" illumination in the case where the illumination source is limited in its ability to illuminate the reticle. The present invention also provides for great flexibility in ameliorating imaging difficulties peculiar to optical lithography, such as so called "proximity effects" that arise when printing small features that are placed close together on the reticle. The ability to correct or reduce such problems through optimizing illumination eliminates the need for time-consuming and costly measures, such as having to create additional masks because the required features for a particular fabrication step cannot print satisfactorily when combined onto a single mask. For example, it is often the case in lithography that yield problems associated with particular mask features do not surface until the masks are made and then actually used to fabricate integrated circuits. Such yield problems are often addressed by changing exposure times or other adjustment of the photoresist process. The present invention allows adjustment of many new degrees of freedom in the lithographic process (i.e., illumination of pixels 40 in FIG. 2), and also provides a system for and method of adjusting them systematically, in that the flow chart of FIG. 4 can be re-executed with adjustments at steps 100, 102 and 106 to compensate for yield problems as they arise.

Since certain changes may be made in the above methodology and system without departing from the scope of the invention described herein, it is intended that all matter contained in the above description or shown in the accompanying drawings shall be interpreted in an illustrative and not in a limiting sense.

What is claimed is:

1. A method of optimizing illumination relative to a known target aerial image irradiance distribution in an imaging system containing a reticle having one or more features to be imaged, a source of illumination, and an entrance pupil having pre-defined pupil regions, the method comprising the steps of:

(a) illuminating the reticle a plurality of times using the source at illumination, each illumination directed at one or more preselected pupil regions in the entrance pupil;

(b) generating and storing a set of reticle aerial image irradiance distributions, each distribution in said set corresponding to one of said pupil regions; and (c) determining and providing an illumination by the source of illumination, based on said set of said reticle aerial image irradiance distributions, that produces an aerial image irradiance distribution having less difference from the target aerial image irradiance distribution than does the set of reticle aerial image irradiance distributions.

2. A method according to claim 1, wherein said step (b) includes calculating numerically said reticle aerial image irradiance distributions.

3. A method according to claim 1, wherein said step (b) includes scanning said reticle aerial image irradiance distributions using an image scanning system that converts irradiance into an electronic signal.

4. A method according to claim 1, wherein said step (a) includes selecting any desired intensity of the source of illumination between 0 and 1, inclusive for said each illumination.

5. A method according to claim 2, wherein said numerically calculating is based on a known mathematical model of the imaging system.

6. A method according to claim 1, wherein the known target aerial image includes one or more target features each corresponding to said one or more features to be imaged, and wherein said one or more target features are identical to corresponding ones of the features to be imaged.

7. A method according to claim 1, wherein the known target aerial image includes one or more target features each corresponding to said one or more features to be imaged, and further comprising the step of modifying said one or more target features by a user of the imaging system prior to said step (c).

8. A method of forming an image of a reticle object in a radiation-sensitive medium using an imaging system having a depth of focus, an entrance pupil, an imaging plane located within the depth of focus, and a source of illumination, the method comprising the steps of:

(a) generating and storing a target object image corresponding to the reticle object;

(b) generating and storing an actual aerial image of the reticle object;

(c) comparing the actual aerial image to the target object image including providing and storing comparison data;

(d) optimizing the illumination provided by the source of illumination in response to the comparison data for imaging the reticle object through the entrance pupil and onto the imaging plane; and (e) exposing the reticle to said optimized illumination to form an aerial image and to transfer said aerial image into the radiation-sensitive medium placed at said imaging plane.

9. A method according to claim 8, wherein said step (b) includes numerically calculating the actual aerial image of the reticle object.

10. A method according to claim 8, wherein the radiation-sensitive medium comprises photoresist.

11. A method according to claim 8, wherein the entrance pupil includes predefined pupil regions and wherein the source of illumination provides to one or more selected ones of the pupil regions and normalized irradiance between 0 and 1, inclusive.

12. Apparatus for providing optimal illumination in an imaging system, comprising:

(a) a source of illumination;

(b) an imaging lens having an entrance pupil and depth of focus;

(c) a reticle having one or more features to be imaged;

(d) a target aerial image comprising one or more target features corresponding to said one or more features to be imaged;

(e) an imaging plane;

(f) determination means for determining aerial images at said imaging plane of one or more of said reticle features;

(g) image analyzing means, coupled to said determination means, for comparing said aerial images of said one or more of said reticle features determined by said determination means to corresponding ones of the target features to define an illumination that minimizes a difference between said one or more of said reticle features and said corresponding ones of the target features, and for generating a first output signal representing said illumination; and (h) illumination control means, coupled to said image analyzing means and said source of illumination, for controlling said source of illumination based on said first output signal so that said source of illumination provides said illumination that minimizes the difference between said one or more of said reticle features and said corresponding ones of the target features.

13. An apparatus according to claim 12, wherein said determination means comprises a scanning system for scanning the imaging plane, for detecting irradiance levels at the imaging and for converting an irradiance level into an electronic signal.

14. An apparatus according to claim 12, wherein said determination means includes a mathematical model of the imaging system and means for determining said aerial images of said reticle features by numeric calculation based on the mathematical model.

15. An apparatus to claim 12, further comprising a support for holding a radiation-sensitive medium in said imaging plane within said depth of focus.

16. An illumination optimization system for use with an imaging apparatus including a source of illumination, an imaging lens having an entrance pupil and depth of focus, a reticle having one or more features to be imaged, and an imaging plane, the optimization system comprising:

(a) determination means for determining aerial images at the imaging plane of one or more of the reticle features;

(b) image analyzing means coupled to said determination means, for comparing said aerial images of said reticle features determined by said determination means to a target aerial imaged for generating illumination data defining an illumination that minimizes the difference between said reticle feature aerial image and said target aerial image, and for outputting said illumination data; and (c) illumination control means, coupled to the source of illumination and said image analyzing means, for controlling said source of illumination based on said illumination data such that said source of illumination provides said illumination that minimizes the difference between said reticle feature aerial image and said target aerial image.

17. A method of operating an imaging system comprising the steps of:

a) illuminating an object to be imaged with an adjustable illumination source such that the object projects an actual aerial image through an entrance pupil onto an image plane;

b) generating data representing the actual aerial image;

c) retrieving from a database target data that defines an ideal aerial image;

d) comparing the data representing the actual aerial image with the target data and generating optimization data in response to the comparing; and e) adjusting the controllable illumination source in response to the optimization data such that differences between the target image and the actual aerial image are decreased.

18. The method according to claim 17, wherein the step c) includes calculating and generating the target data based on a predetermined mathematical model of the imaging system.

19. The method according to claim 18, wherein the step c) further includes manually modifying the target data by a user of the imaging system.

20. The method according to claim 17, wherein the step b) includes calculating the data representing the actual aerial image based on a predetermined mathematical model of the imaging system.

21. The method according to claim 17, wherein the step b) includes the step of scanning the actual aerial image from the image plane including detecting varying irradiance levels at the image plane.

22. The method according to claim 17, wherein the entrance pupil is defined by a plurality of pupil pixels, the optimization data includes pupil pixel data, and the step e) includes adjusting a direction of illumination from the illumination source toward the object in response to the optimization data such that a direction of illumination passing through at least one preselected pupil pixel of the entrance pupil is adjusted.

23. The method according to claim 22, wherein the step e) further includes illuminating the object at least one more time comprising:

i) selecting at least one other pupil pixel of the entrance pupil each of said at least one more time; and ii) adjusting the direction of illumination from the illumination source toward the object each of said at least one more time such that the direction of illumination passing through at least one other selected pupil pixel of the entrance pupil is adjusted each of said at least one more time.

24. The method according to claim 17, wherein the entrance pupil is defined by a plurality of pupil pixels, the optimization data includes pupil pixel data, and the step e) includes adjusting an intensity of illumination from the illumination source toward the object in response to the optimization data, such that an intensity of illumination passing through at least one preselected pupil pixel of the entrance pupil is adjusted.

25. The method according to claim 24, wherein the step e) further includes illuminating the object at least one more time comprising;

i) selecting at least one other pupil pixel of the entrance pupil each of said at least one more time; and ii) adjusting the intensity of illumination from the illumination Source toward the object each of said at least one more time such that the intensity of illumination passing through at least one other selected pupil pixel of the entrance pupil is adjusted each of said at least one more time.

\* \* \* \* \*